United States Patent

Hutchison et al.

[11] Patent Number: 5,905,640
[45] Date of Patent: May 18, 1999

[54] SECURITY VIA HOLE(S) FOR PRINTED CIRCUIT BOARDS

[75] Inventors: Brian G. Hutchison; Eric G. Lyons; Jan Durajczyk, all of Dundee, United Kingdom

[73] Assignee: NCR Corporation, Dayton, Ohio

[21] Appl. No.: 09/079,740

[22] Filed: May 15, 1998

[30] Foreign Application Priority Data

Sep. 10, 1997 [GB] United Kingdom .................. 9719118

[51] Int. Cl.$^6$ .............................. G06F 12/14; G06F 7/04
[52] U.S. Cl. ..................... 361/783; 361/748; 361/760; 174/255; 174/266; 395/186; 711/164; 324/764; 257/922
[58] Field of Search ..................... 361/748, 760, 361/783; 174/255, 266; 395/186, 188.01; 711/164; 364/918.7, 949.96; 324/763, 764; 257/922

[56] References Cited

U.S. PATENT DOCUMENTS

| | | |
|---|---|---|
| 4,504,821 | 3/1985 | Barnes .................................. 340/146.2 |
| 4,513,389 | 4/1985 | Devchoudhury ..................... 364/918.7 |
| 5,203,004 | 4/1993 | Bunton et al. ..................... 395/750.08 |
| 5,360,948 | 11/1994 | Thornberg ............................. 174/263 |
| 5,459,355 | 10/1995 | Kreifels .................................. 257/758 |
| 5,734,819 | 3/1998 | Lewis ..................................... 395/186 |
| 5,814,847 | 9/1998 | Shihadeh et al. ....................... 257/209 |

FOREIGN PATENT DOCUMENTS 2219421  12/1989  United Kingdom .

Primary Examiner—Leo P. Picard
Assistant Examiner—John B. Vigushin

[57] ABSTRACT

A secure access circuit provided on a PCB (10) by designating a via hole (26) as a security via hole, storing data relating to the address and status (intact or drilled-out) of the via hole in a connectable EPROM (26), determining the status of the security via hole, and authorizing access of the EPROM only if stored data and determined status of the hole are identical. Circuit (44) can be upgraded by use of different EPROMs; by use of different PCBs with different security via holes corresponding to each upgrade, an illegally copied EPROM providing upgraded facilities by use of a printed circuit board cannot be used on a PCB (10) intended to provide only basic facilities.

10 Claims, 2 Drawing Sheets

SECURITY VIA HOLE(S) FOR PRINTED CIRCUIT BOARDS

BACKGROUND OF THE INVENTION

This invention relates to printed circuit boards (PCBs) especially to boards used to carry microprocessor-controlled circuits which are capable of being upgraded.

Conventionally, PCBs are used in complex equipment, such as the printer or dispenser in an automated teller machine; such items are designed to be capable of upgrades and improved functionalities. When a customer requests an upgrade, the whole PCB is replaced, although in many cases the upgraded functionality is provided simply by replacing a memory circuit, such as an EPROM, while the remainder of the circuit is unchanged. Naturally the manufacturer charges a substantial sum for the upgrade to each item of equipment in order to cover the original development costs.

Plug-in components such as EPROMS are however relatively easy to copy. There is a risk that, by dishonest copying of the EPROM or other memory device, PCBs can be upgraded without recourse to the manufacturer.

SUMMARY OF THE INVENTION

It is the object of the invention to provide a PCB having a built-in security feature.

According to the invention a method of authorizing access to a circuit on a printed circuit board (PCB), characterized by:

designating at least one selected via hole on the PCB as a security via hole;

storing data related to said at least one security via hole in memory means operative in the circuit; and authorizing access to the circuit only when said memory device identifies the at least one security via hole.

Also according to the invention a secure access circuit comprising a printed circuit board having a plurality of via holes and carrying a circuit including memory means or connection means to connect memory means, characterized in that the memory means contains:

a) stored data relating to the conducting status of at least one predetermined via hole;

b) an instruction to determine the conducting status of said at least one via hole; and c) an instruction to access the circuit only when the stored data matches the determined conducting status.

Further according to the invention a method of controlling upgrades of a memory-driven upgradeable circuit, characterized by:

providing for each grade of circuit a printed circuit board having a different arrangement of at least one security via hole;

providing for each grade of circuit a memory device containing stored data relating to the associated arrangements of at least one security via hole;

providing on all circuit boards a standard memory-driven circuit; and authorizing access of the memory device to the standard circuit only when the recorded and actual arrangements of said at least one security via hole are identical.

A PCB is conventionally a layer of insulating material having a pattern of conducting tracks on at least one surface. Often there are two or more insulating layers with one or more further conducting track layers sandwiched between them; as many as twelve insulating layers may be provided.

In this specification a "via hole" means an aperture (usually circular) through all the layers of the PCB, the aperture being metal plated to provide electrical contact between the internal and outer conducting layers. Via holes are drilled and plated during manufacture of the board. An alternative name for a via hole is a feed through.

In a conventional PCB there are many, often several thousand, via holes, many of which will form connections between components of the circuit on the board, such as surface mount components. If a via hole is not required as a connection, it can be simply drilled out to remove the metal coating during the mass production process of the circuit boards. Subsequent replacement of the coating to reinstate the connection is extremely difficult.

BRIEF DESCRIPTION OF THE DRAWINGS

The invention will now be described by way of example only with reference to the accompanying drawings in which.

DETAILED DESCRIPTION

Figure 1A:
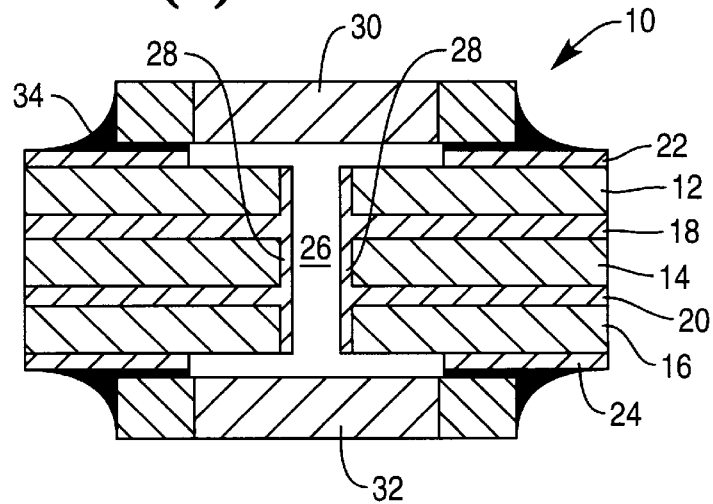
FIG. 1(a) is the section through a conventional printed circuit board showing a via hole.

In FIG. 1(a) a conventional PCB 10 comprises three layers 12,14,16 of insulating material having between them two layers 18,20 of metal formed into a pattern in accordance with the circuit function of the PCB. Further conducting tracks 22,24 are formed on some areas of the upper and lower surfaces of the PCB 10.

A via hole 26 comprises a hole formed through the layers 12,14,16 which is coated with metal 26 to provide electrical connections between the conducting layers 18,20,22,24.

In use the PCB 10 carries surface mount components 30,32 on its upper and lower surfaces respectively, and such components are soldered to the adjacent parts of the conducting tracks 22,24, the solder fillets being illustrated at 34. The components cover the via holes so they are not visible when the PCB is populated.

Figure 1B:
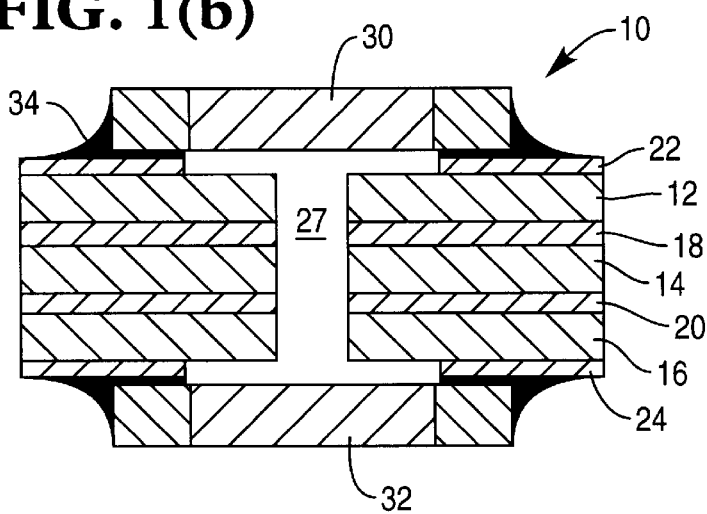
FIG. 1(b) is the section through a PCB having a via hole from which the plating has been removed.

FIG. 1(b) also shows a PCB 10, all parts of the PCB corresponding to those in FIG. 1(a) being indicated by the same reference numerals. It will easily be seen that the central aperture 27 does not have a metal coating, so it is no longer electrically conducting.

Via holes are normally plated-through during the manufacturing process; afterwards the plating can simply be removed by drilling the hole to a slightly larger diameter. This is done during preparation of a batch of PCBs before assembly of the surface mount components on the PCB when a particular connection between conducting layers is not required.

In this specification the term "conducting status" of a via hole refers to whether the via hole is plated-through or drilled-out.

A standard PCB 10 conventionally has a substantial number of via holes, for example 1000; their placement on the board is known, and the electrical connections between layers which they provide are used in the circuit design and layout process.

When a PCB is to be used in complex equipment which is known to be upgradeable, then at the design stage, one or more via holes 26 are specified as a security feature.

Figure 2:
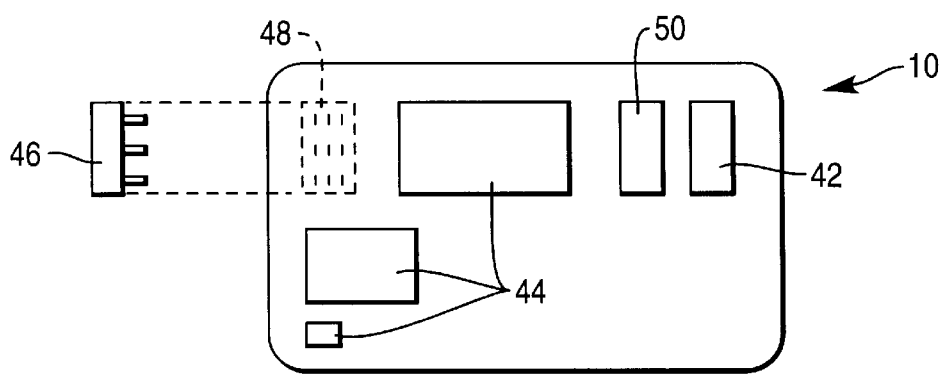
FIG. 2 is a view of a circuit board.

A view of a secure access PCB 10 according to the invention is shown in FIG. 2. The PCB carries a micro-processor 42, a number of other surface mount components 44, a plug-in EPROM 46 connected to a socket 48 on the board, and a RAM 50.

Figure 3:
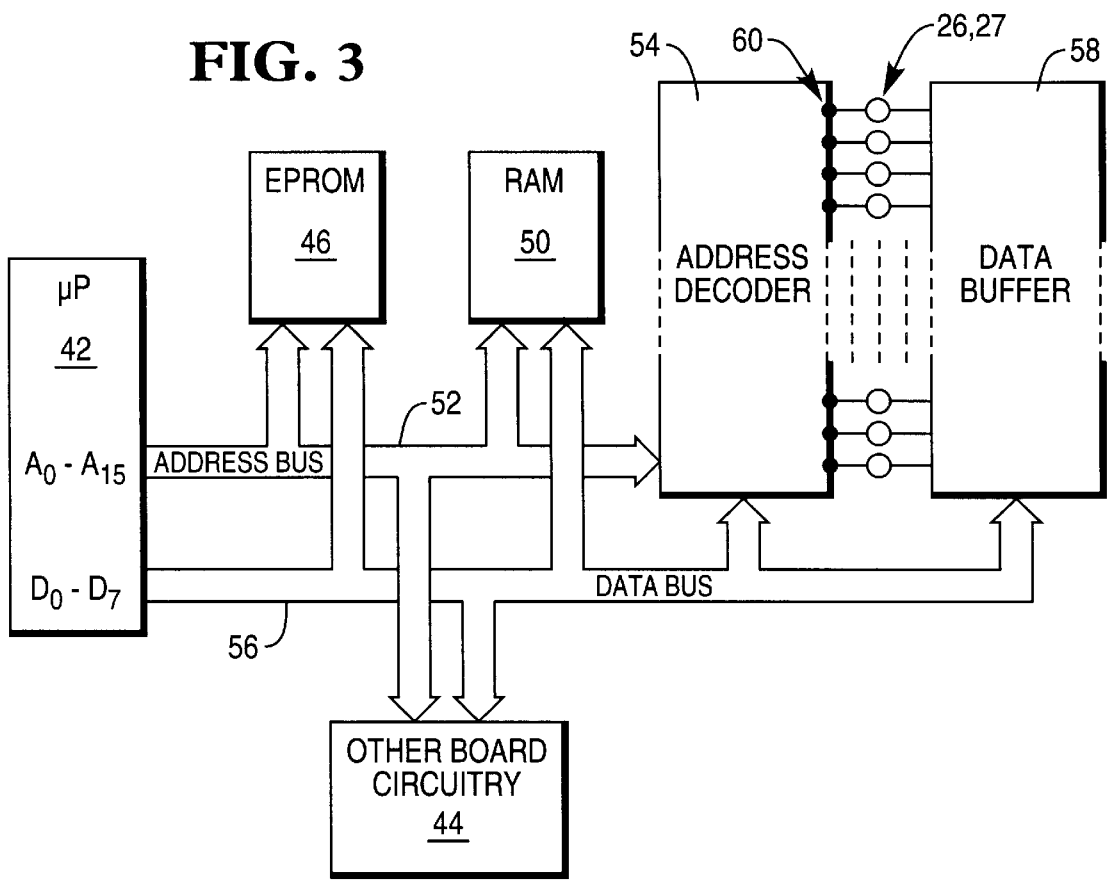
FIG. 3 is a schematic diagram of operational components of a secure circuit board according to the invention.

The operational connections are shown in FIG. 3. The address ports $A_0$ to $A_{15}$ of the micro-processor 42 are connected by an address bus 52 to the EPROM 46, circuitry 44, the RAM 50 and an address decoder 54. The data ports $D_0$ to $D_7$ of the micro-processor 42 are connected by a data bus 56 to the EPROM 46, circuitry 44, RAM 50 and address decoder 54, and also to a data buffer 58. Between the address decoder 54, and the data buffer 58 are shown a number of via holes, both with and without conducting layers and therefore referenced 26,27. Each via hole is connected to one connector pin 60 on the address decoder 54. The address decoder 54 operates as a memory map, allowing the micro-processor 42 to address a selected via hole 26,27, i.e. a via hole at a known physical position on the PCB 10. The micro-processor 42 senses the presence or absence of a voltage (conventionally 5 volts) on the connection pin 60 corresponding to that via hole, the voltage being present for a conducting via hole 26 and being indicated as a binary 1, and absent (binary 0) for a drilled-out via hole 27.

Suppose the PCB 10 has a designated security via hole at a known address which is electrically conducting; the PCB 10 carries a circuit 44 operating under the control of a basic-function micro-processor 42, the EPROM containing a record of the address and the conducting status (1) of the security via hole 26. When the micro-processor requires access to the circuitry 44 on the PCB the micro-processor accesses the connection pin of the security via hole through the memory mapping function. The micro-processor accesses the relevant connection pin, senses the presence or absence of a voltage on the connection pin and compares the 1 or 0 so determined with the data stored in the EPROM. If a binary 1 is found (in this example), the micro-processor gains access to the circuitry 34. If a binary 0 is found, access of the circuit 44 is denied by the micro-processor 42.

Suppose now the circuit is to provide increased functionality; the basic circuitry remains identical except that it is mounted on a PCB 10 having the security via hole now drilled out. An upgraded EPROM is connected to the socket 48 and instructs the micro-processor 42 to test the security via hole, expecting now a binary 0; if this is sensed, access to the circuitry is granted.

If however the upgraded EPROM is connected to the original PCB 10, the test will detect a binary 1 while the upgraded EPROM expects a binary 0 and access of the upgraded circuit on the basic board will be denied. Thus if a dishonest customer acquires an EPROM copied illegally from an upgraded board and plugs it into a basic board, access to the circuit is denied.

Figure 4:
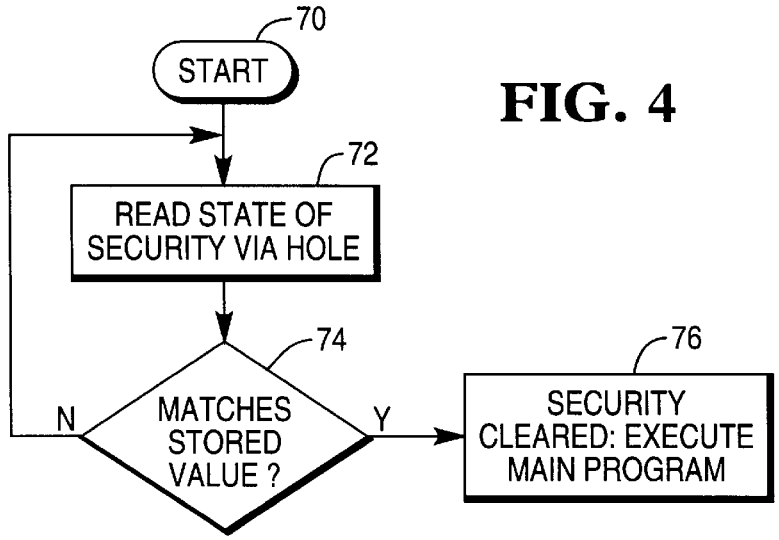
FIG. 4 is a simple flow chart indicating operation of the invention.

FIG. 4 shows a simple flow chart. At start 70, the EPROM 46 issues an instruction to the micro-processor 42 to determine the conducting status of a connection pin 60 at a particular address on the address decoder 54, and provides an associated binary digit as recorded in the EPROM. At step 72 the micro-processor 42 reads the connection pin and provides a binary 1 or 0.

In step 74, the micro-processor 42 compares the sensed binary digit with the binary digit provided by the EPROM. If there is a match, the micro-processor provides in step 72 an appropriate signal to the EPROM 46 to indicate security clearance, and the micro-processor can then access the circuitry 44 and then access the main program, such as operation of a printing device in an ATM. If there is not a match, the program returns to a "ready" position, illustrated as lying between step 70 and 72, for receipt of a subsequent start instructions.

In a variation, for extra security, two or more via holes may be addressed, and access of the EPROM 46 granted only if the EPROM contains the correct binary digit for both or all via holes.

Suppose now that a circuit on a PCB is capable of being operated at three or more levels of service or is capable of multiple upgrades. A group of e.g. eight via holes is selected for the security feature; on a PCB 10 which is to provide a basic level of service, all eight via holes are drilled-out, so that all eight when tested will provide binary 0. In a first level upgrade, only seven of the eight security holes are drilled-out while one via hole is intact and provides a binary 1. In a second level of upgrade, two of the holes remain intact, and so on.

A disadvantage of this arrangement is that if a dishonest user can identify the connection pins which provide the binary 1 on the upgraded circuits, the pins can be jumpered together, thus defeating the security arrangement.

In an alternative arrangement, all eight holes are originally intact, and then 1,2,3 etc. holes are drilled out to provide the 1st, 2nd, 3rd etc. upgrade or enhance service level.

A further feature may be used to provide additional security. If a via hole has been drilled-out to provide a security feature, the layout of the surface mount components on the PCB is designed so that the drilled-out hole or holes are covered by surface mount components. Optionally such components may be placed on both sides of the PCB 10, such as a resistor pack on one side and a RAM chip on the others. In such an arrangement, not only is the drilled-out hole or holes difficult to reinstate, they are difficult to locate on the board in the first place.

A secure access PCB 10 according to the invention can be used in the replaceable and upgradeable items of equipment in a complex electrical product which is conventionally upgraded by replacement of the PCB. For example, in an automated teller machine, the dispenser and the printer and other modules are upgradeable and improved functionality can be provided by slotting in a new board. Application of a secure access circuit according to the invention helps to ensure that all such upgrades are provided by the manufacturer of the equipment. In a variation, if the micro-processor 42 is itself programmable, the program data can be stored within it and there is no requirement for a plug-in memory such as the EPROM 46; the micro-processor 42 then secures the PCB 10.

The invention may be implemented in any software to be run in combination with hardware/firmware on a printed circuit board, the software being arranged to decide whether it is itself authorized to access the hardware or firmware.

What is claimed is:

1. A method of authorizing access to a circuit on a printed circuit board (PCB), the method comprising the steps of:
   (a) designating at least one selected via hole on the PCB as a security via hole;
   (b) storing data related to the at least one security via hole in a memory device operative in the circuit; and
   (c) authorizing access to the circuit only when the memory device identifies the at least one security via hole.

2. A method according to claim 1, wherein step (b) includes the step of:

(b-1) storing data relating to the address and the conducting status of the at least one security via hole.

3. A method according to claim 1, wherein step (c) includes the steps of:

(c-1) instructing a processor to determine status of the at least one security via hole; and (c-2) preventing access to the circuit if the determined status in step (c-1) differs from stored status.

4. A secure access circuit comprising:

a printed circuit board having a plurality of via holes and carrying a circuit including memory means, the memory means including (i) stored data relating to the conducting status of at least one predetermined via hole, (ii) an instruction for determining the conducting status of the at least one via hole, and (iii) an instruction to access the circuit only when the determined conducting status matches the stored data.

5. A secure access circuit according to claim 4, wherein the memory means forms part of processing means on the PCB.

6. A secure access circuit according to claim 4, wherein the memory means is connectable to connection means on the PCB.

7. A secure access circuit according to claim 4, wherein the PCB carries surface mount components positioned on the board to cover each predetermined via hole.

8. A method of controlling upgrades of a memory-driven upgradeable circuit, the method comprising the steps of:

providing for each grade of circuit a printed circuit board having a different arrangement of at least one security via hole;

providing for each grade of circuit a memory device containing stored data relating to the associated arrangements of at least one security via hole;

providing on all circuit boards a standard memory-driven circuit; and authorizing access of the memory device to the standard circuit only when the recorded and actual arrangements of the at least one security via hole are identical.

9. A method according to claim 8, further comprising the steps of:

providing a group of N via holes designated as security via holes;

providing for the basic graded circuit a PCB having all N via holes drilled-out; and providing for each successive upgraded circuit a PCB having N-1, N-2 etc. via holes drilled-out.

10. A method according to claim 8, further comprising the steps of:

providing a group of N via holes designated as security via holes;

providing for the basic graded circuit a PCB having all N via holes plated-through; and providing for each successive upgraded circuit a PCB having 1,2 etc. via holes drilled-out.

* * * * *